United States Patent
Yamamoto et al.

(10) Patent No.: US 7,155,245 B2
(45) Date of Patent: Dec. 26, 2006

(54) MULTIPATH DISTORTION ELIMINATING FILTER

(75) Inventors: Yuji Yamamoto, Saitama-ken (JP); Toshiaki Kubuki, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 343 days.

(21) Appl. No.: 10/917,411

(22) Filed: Aug. 13, 2004

(65) Prior Publication Data
US 2005/0053177 A1 Mar. 10, 2005

(30) Foreign Application Priority Data
Aug. 19, 2003 (JP) ............................. 2003-207869

(51) Int. Cl.
*H04B 1/00* (2006.01)
*H04B 7/01* (2006.01)
(52) U.S. Cl. .................... 455/506; 455/65; 455/63.1
(58) Field of Classification Search .............. 455/506, 455/65, 501, 504, 63.1, 67.13, 278.1, 225, 455/295, 296; 375/346, 347, 349, 350
See application file for complete search history.

(56) References Cited

U.S. PATENT DOCUMENTS

| | | | | | |
|---|---|---|---|---|---|
| 4,499,606 A | * | 2/1985 | Rambo | ..................... | 455/277.2 |
| 4,942,622 A | * | 7/1990 | Takayama et al. | ........ | 455/277.2 |
| 5,157,691 A | * | 10/1992 | Ohkubo et al. | .............. | 375/232 |
| 5,349,609 A | * | 9/1994 | Tsujimoto | .................... | 375/347 |
| 2005/0041764 A1 | * | 2/2005 | Yamamoto et al. | ......... | 375/350 |
| 2005/0044121 A1 | * | 2/2005 | Yamamoto et al. | ......... | 708/301 |
| 2005/0123035 A1 | * | 6/2005 | Yamamoto et al. | ......... | 375/234 |
| 2005/0181741 A1 | * | 8/2005 | Raj et al. | ....................... | 455/73 |

* cited by examiner

*Primary Examiner*—Sonny Trinh
(74) *Attorney, Agent, or Firm*—Arent Fox PLLC

(57) ABSTRACT

An adaptive filter for an FM receiver comprises a digital filter, an error detection section for detecting an error between the amplitude of the output signal of the digital filter and a reference value, and a coefficient updating section for updating tap coefficients so as to minimize the error detected. The reference value for determining the error is variably set according to the amplitude of an input signal. This eliminates the effect of Doppler fading included in the reception wave and stabilize the adaptive processing. Thus, the adaptive filter can remove multipath distortion with reliability.

8 Claims, 8 Drawing Sheets

MULTIPATH DISTORTION ELIMINATING FILTER

BACKGROUND OF THE INVENTION

The present invention relates to a multipath distortion eliminating filter which is mounted on an FM receiver to eliminate multipath distortion occurring in reception waves.

The present application claims priority from Japanese Patent Application No. 2003-207869, the disclosure of which is incorporated herein by reference.

Among problems of importance in FM radio broadcasts is interference that results from multipath distortion of the reception waves. Multipath distortion is the phenomenon that an FM reception wave signal, which should basically have a constant amplitude, varies in amplitude because of mutual interference between a plurality of incoming waves having different phases and different field intensities due to multiple wave propagation. In particular, FM receivers mounted on mobile units, such as a car radio, sometimes encounter multipath distortion with sharp fluctuations in amplitude since the state of reception varies with movement. Multipath distortion can cause pulsed noise in FM demodulation signals, contributing to a deterioration in reproduction sound quality.

Conventionally, mobile FM receivers such as a car radio have exercised such controls as ARC (Automatic Reception Control) in order to reduce noise included in the reproduction sound demodulated. In the methods of reducing noise through ARC control and the like, however, the noise suppression has been achieved at the cost of sound quality of some sort, including the stereophonic feel of the demodulated sound. These methods have thus been far from achieving substantial elimination of the multipath distortion.

Now, with the speed up of digital signal processing technologies in recent years, attention is being given to digital FM receivers in which FM reception waves downconverted into intermediate frequency signals are converted into digital signals for digitalized signal processing at the subsequent stages, including wave detection. In such digitalized FM receivers, multipath distortion can be eliminated through the use of adaptive digital filters that have characteristics inverse to the transfer functions of the transmission paths from broadcast stations to the receivers.

FIG. 1 shows an example of the adaptive digital filter for eliminating multipath distortion, which is made of an FIR type filter. Tap coefficients Km of this filter are updated according to the algorithm called CMA (Constant Modulus Algorithm). More specifically, adaptive processing is exercised in consideration of the characteristic of FM signals that the amplitude should basically be constant. Here, the tap coefficients Km are updated and converged so as to minimize an error err between the envelope (amplitude) of the output signal past the filter and a reference value, whereby a filter characteristic for eliminating multipath distortion is provided.

For mobile FM receivers, the reception waves incoming in a multiplex fashion can cause slight deviations in frequency due to vehicle movement. In such a state of reception, components of amplitude variation so-called Doppler fading can occur in the reception waves. With Doppler fading, components of variations as relatively slow as around several hertz to ten-odd hertz are superimposed on the multipath-based sharp amplitude variations of the reception waves.

When reception waves containing such distortion components ascribable to Doppler fading are subjected to the adaptive processing of the filters according to the conventional CMA method described above, however, the filters might follow the Doppler fading and fail to reduce the error err to zero steadily. The adaptive processing of the filters has thus become unstable sometimes.

SUMMARY OF THE INVENTION

The present invention has been achieved in view of the conventional problems described above. It is thus an object of the present invention to provide a multipath distortion eliminating filter to be mounted on an FM receiver, which performs proper adaptive processing at high speed and thereby eliminates multipath distortion with reliability, for example.

According to one of the aspects of the present invention, a multipath distortion eliminating filter comprises: a digital filter for applying filter operation processing to a digital reception signal, as an input signal, containing a multipath-based distortion component, to eliminate the distortion component, the digital filter having a plurality of tap coefficients; error detection means for detecting an error between amplitude of an output signal output from the digital filter and a reference value; and coefficient updating means for predicting and computing a filter characteristic of the digital filter so as to minimize the error detected, and updating each of the tap coefficients of the digital filter based on the result predicted and computed. Here, detection means for detecting amplitude of the input signal is provided, and the reference value is variably set according to the amplitude of the input signal detected by the detection means.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
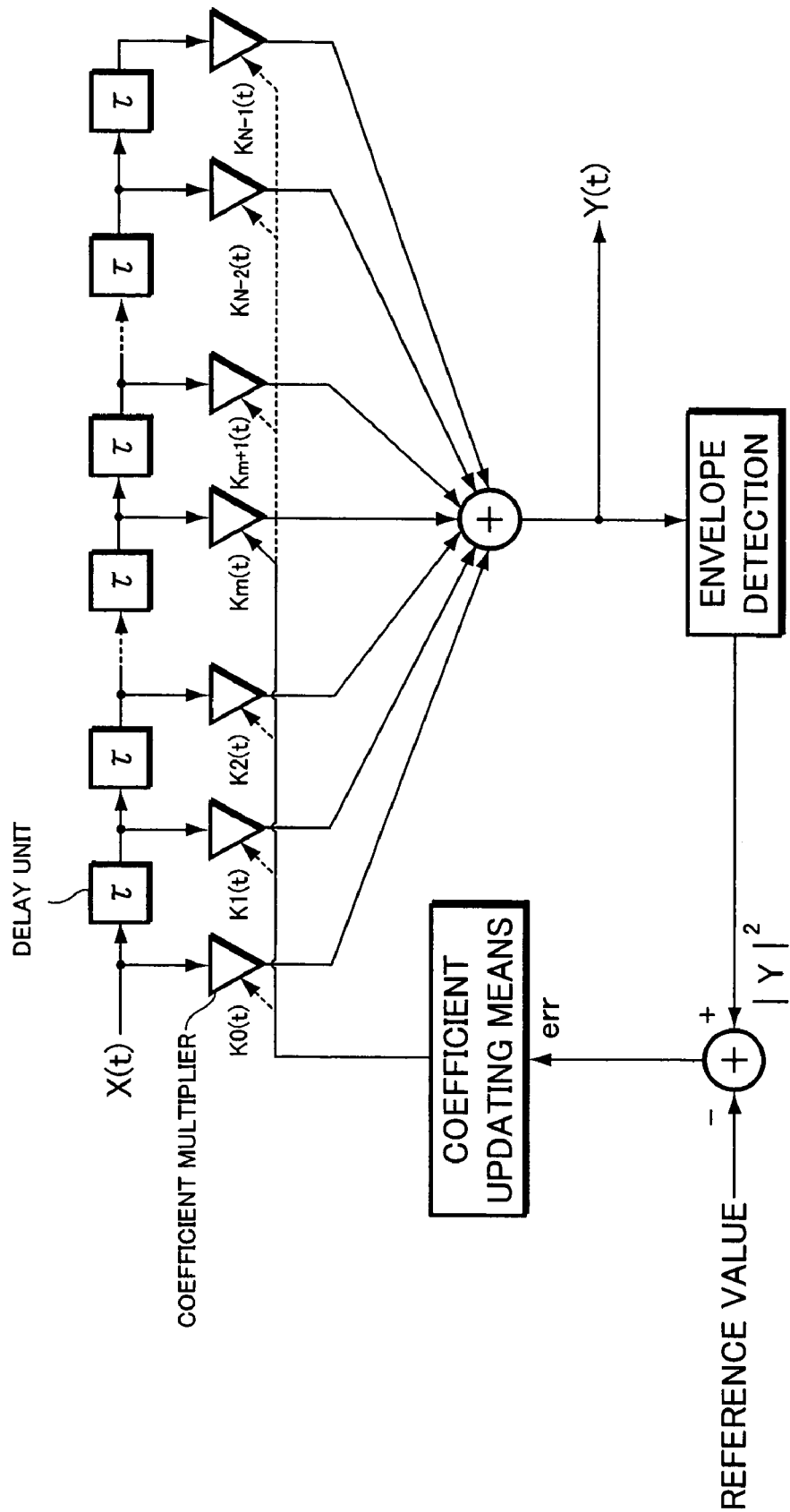
FIG. 1 is a block diagram showing the configuration of a conventional adaptive filter.
Figure 2:
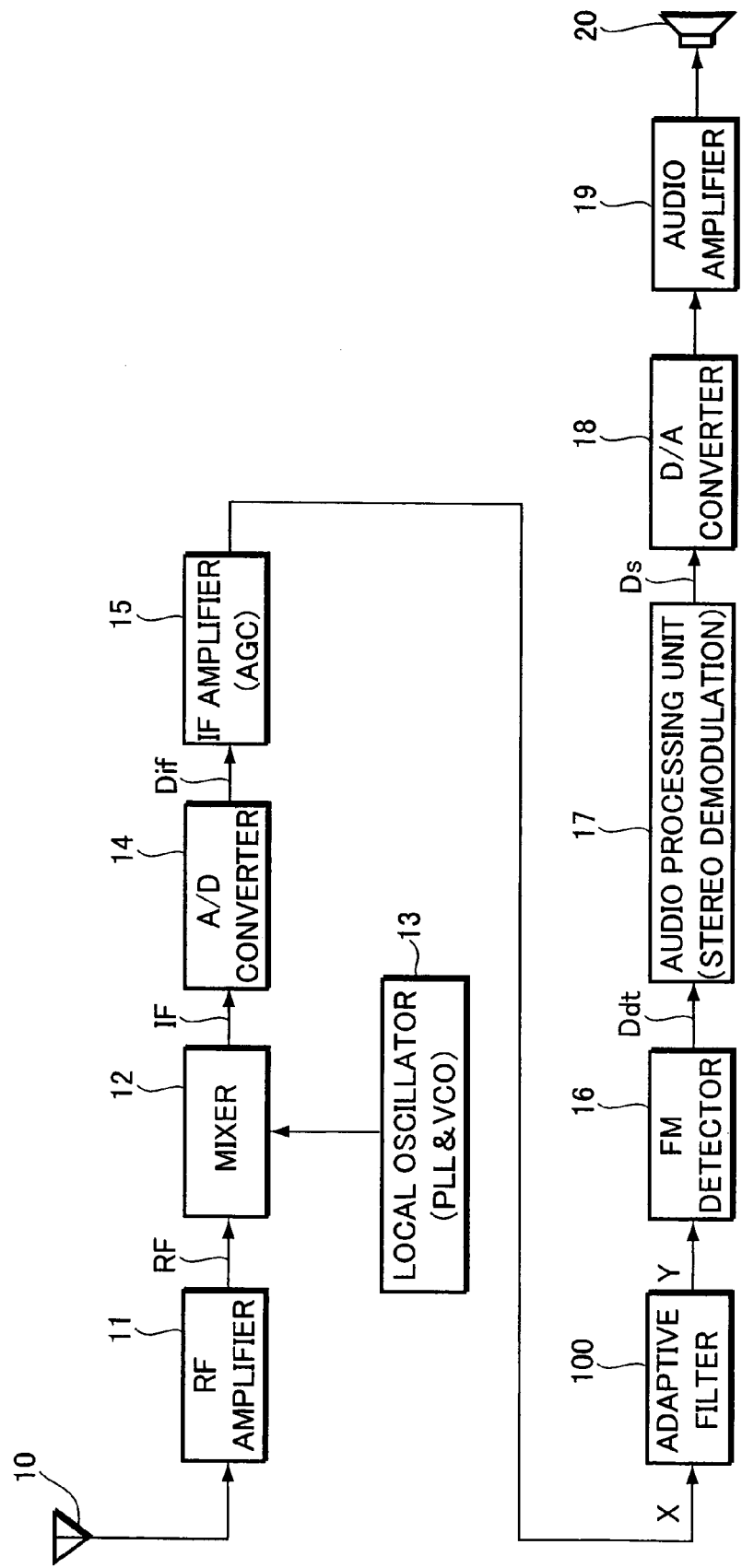
FIG. 2 is a block diagram showing the configuration of an FM receiver according to the present invention.

Hereinafter, a most preferred embodiment of the present invention will be described with reference to the drawings. Description will initially be given of an FM receiver on which an adaptive filter 100 according to the present embodiment is mounted. FIG. 2 is a block diagram showing the configuration of a digital FM receiver such as a car radio.

In the diagram, the FM-broadcast reception wave received by an antenna circuit 10 is amplified by an RF amplifier (radio frequency amplifier) 11. The resulting RF signal is output to a mixer 12. The mixer 12 mixes the RF signal with a local oscillation signal from a local oscillator 13, which is composed of a PLL circuit, a VCO circuit, etc. An intermediate frequency signal IF of downconverted frequency is thus generated, and supplied to an A/D converter 14. The A/D converter 14 converts the intermediate frequency signal IF, an analog signal, into a digital sample value signal (hereinafter, "digital signal") Dif at predetermined regular sampling periods.

The intermediate frequency signal Dif, a digitally-converted signal, is amplified by an IF amplifier (intermediate frequency amplifier) 15. The IF amplifier 15 has an automatic gain control (AGC) function. It outputs the intermediate frequency signal Dif of constantly stable amplitude to the adaptive filter 100, an FM detector 16, and the like in subsequent stages regardless of the field intensity of the reception wave.

The adaptive filter 100 applies digital signal processing chiefly intended for the elimination of multipath distortion to the intermediate frequency signal Dif of adjusted amplitude, and outputs the resultant to the FM detector 16 in the subsequent stage. The configuration and operation of this adaptive filter 100 will be detailed later.

The FM detector 16 applies digital detection processing of a predetermined detection system to the intermediate frequency signal Dif past the adaptive filter 100, thereby generating a detection signal Ddt which is a composite signal. Then, in an audio processing unit 17, the detection signal Ddt is subjected to mute processing, high-cut control processing, and the like on the basis of the field intensity of the reception wave. The resultant is also demodulated in stereo, thereby being separated into right and left audio signals Ds.

Then, the audio signals Ds are converted into respective analog signals by a D/A converter 18. An audio amplifier 19 in the subsequent stage amplifies and supplies the analog audio signals to speakers 20, whereby the received FM-broadcast sound is reproduced.

Figure 3:
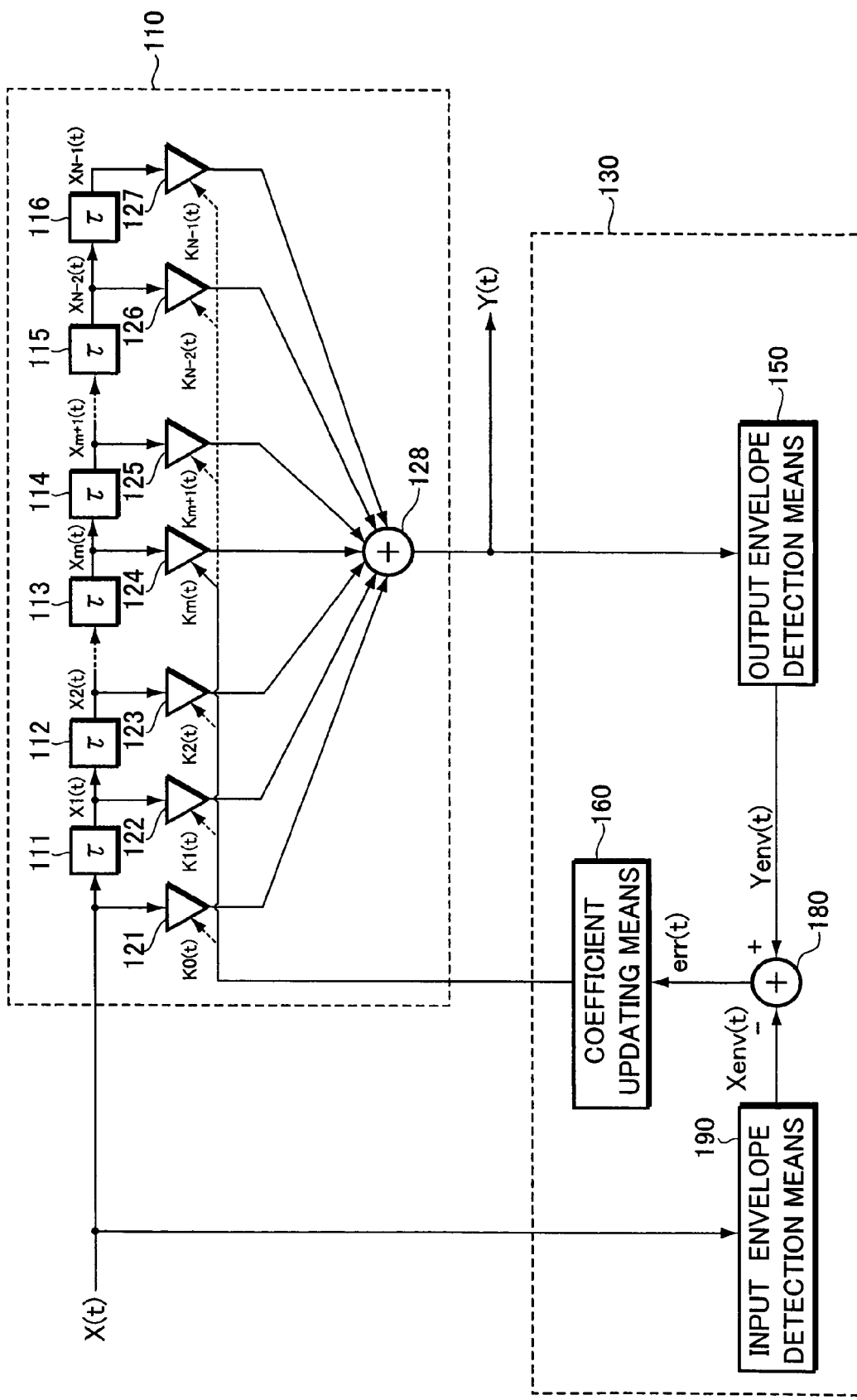
FIG. 3 is a block diagram showing the configuration of an adaptive filter according to an embodiment of the present invention.

Next, the adaptive filter 100 for eliminating multipath distortion occurring in the FM reception wave will be described with reference to the drawings. FIG. 3 is a block diagram showing the configuration of the adaptive filter 100. Although operations of complex values are needed originally, the shown case will deal with a simplified configuration where a unit delay time τ is ¼ with respect to the signal period of an input signal X(t). This adaptive filter 100 comprises an FIR type digital filter 110 and adaptive processing means 130. For the input signal X(t), the digital filter 110 receives the FM intermediate frequency signal Dif that is A/D-converted. The adaptive processing means 130 performs adaptive processing on the digital filter 110 so that the digital filter 110 has a filter characteristic for functioning as a so-called inverse filter which eliminates multipath distortion occurring in the FM intermediate frequency signal.

Referring to FIG. 3, description will be given about the configuration of the digital filter 110. The digital filter 110 is made of an FIR (Finite Impulse Response) type filter of order N, including (N−1) delay units 111–116, N coefficient multipliers 121–127, and an adder 128. Here, the order N of the digital filter 110 is determined to be an appropriate number in consideration of the frequency of the input signal, the operation accuracy of the filter, the period available for operation (critical path), etc.

When the input signal X(t) of the digital filter 110 is input to the delay unit 111 in the initial stage, the delay unit 111 holds a sampled value of the input signal X(t) in synchronization with a reference clock, or by the unit delay time τ, and outputs it to the delay unit 112 in the subsequent stage. Similarly, the delay unit 112 delays the delayed value X1(t) of the input signal by one reference clock (unit delay time τ), and outputs it to the delay unit in the subsequent stage. The subsequent delay units 113–116 also shift the delayed values of the input signal X(t) in succession while accumulating the delay times in synchronization with the reference clock.

The coefficient multipliers 121–127 multiply the input signal X(t) and the delayed values X(t−1), X(t−2), . . . , X(t−N+1), which are held in the delay units 111–116 and are delayed by one, two, . . . , (N−1) unit delay times, by their respective filter coefficients (hereinafter, referred to as "tap coefficients"). The resultants are output to the adder 128. The adder 128 adds these coefficient-multiplied signals, and outputs the resultant as an output signal Y(t) of the digital filter 110.

Next, description will be given about the adaptive processing means 130 which performs adaptive processing on the digital filter 110 described above. Incidentally, the adaptive processing means 130 performs processing for updating the tap coefficients Km of the digital filters 110 at regular operation periods for final convergence so that the output signal Y(t) of the filter has a constant amplitude Yenv(t).

The adaptive processing means 130 comprises: output envelope detection means 150 for detecting an envelope Yenv(t) of the output signal Y(t), which corresponds to the amplitude of the same; input envelope detection means 190 for detecting an envelope Xenv(t) of the input signal X(t), which corresponds to the amplitude of the same; a comparator 180; and coefficient updating means 160.

Figure 4:
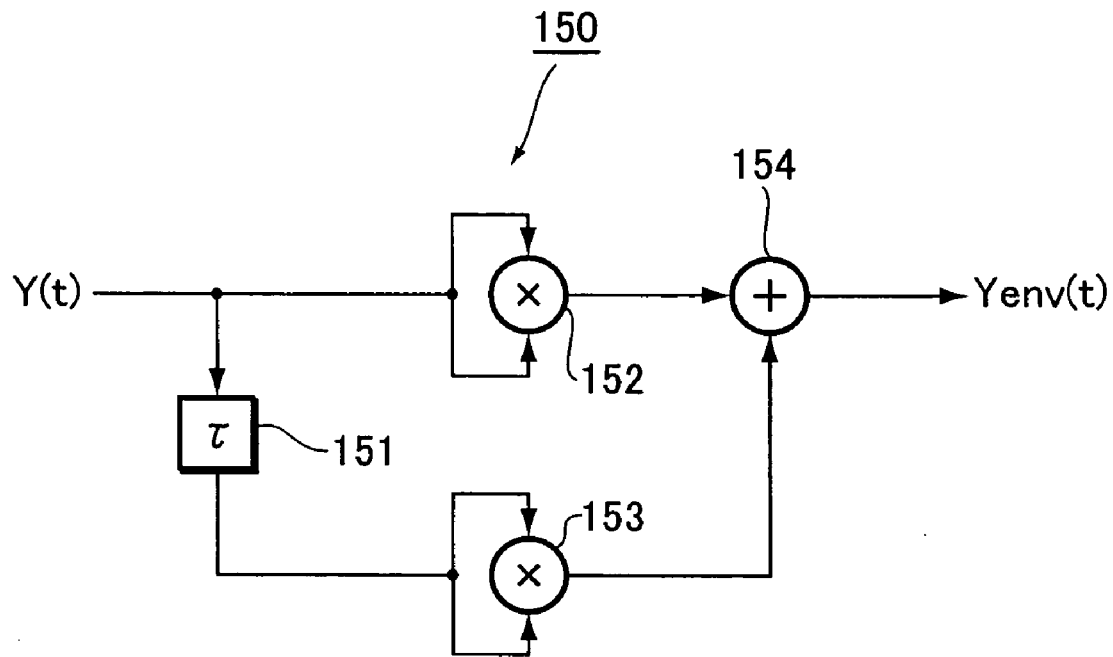
FIGS. 4A and 4B are block diagrams showing configurations of the output envelope detection means shown in FIG. 3.
Figure 4:
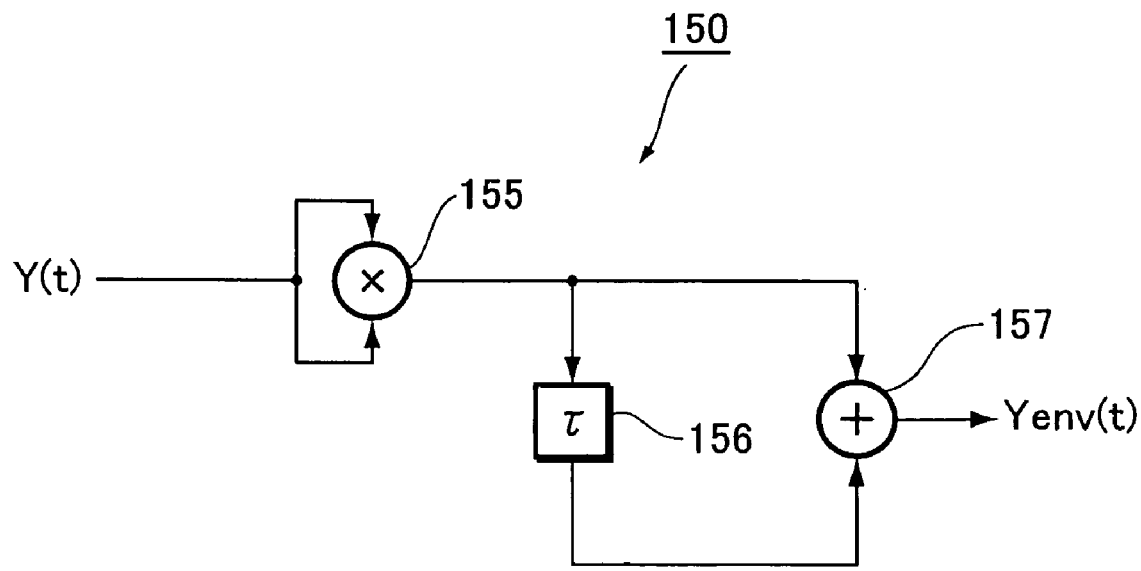

The output envelope detection means 150 detects the envelope Yenv(t) of the output signal Y(t) based on the equation (1) as seen later. FIGS. 4A and 4B are block diagrams showing examples of configuration of the output envelope detection means 150.

In FIG. 4A, the output envelope detection means 150 comprises a delay unit 151, multipliers 152 and 153, and an adder 154. The delay unit 151 holds the filter output signal Y(t) over the unit delay time τ in synchronization with the reference clock, and outputs the delayed value Y(t−1) of the delayed output signal to the multiplier 153. The multipliers 152 and 153 determine the squares of the filter output signal Y(t) and the delayed value Y(t−1), respectively. The adder 154 adds the squared values output from the multipliers 152 and 153 to determine the envelope Yenv(t) of the filter output signal Y(t).

$$Y\text{env }(t)=Y(t)^2+Y(t-1)^2 \qquad (1)$$

The output envelope detection means 150 may have the configuration shown in FIG. 4B. In this case, the envelope detection means 150 comprises a multiplier 155, a delay unit 156, and an adder 157. The multiplier 155 determines the square of the filter output signal Y(t), and outputs it to the delay unit 156 and the adder 157. The delay unit 156 holds the squared value of the filter output signal Y(t) over the unit delay time τ, and outputs the value delayed by the time τ to the adder 157. The adder 157 adds the squared value of the filter output signal Y(t) and the value delayed by the time τ to determine the envelope Yenv(t) of the filter output signal Y(t).

According to the output envelope detection means 150 configured as shown in FIG. 4B, the envelope Yenv(t) based on the equation (1) can be determined by using the configuration with a smaller number of computing units. This means a relative increase in operation speed.

Figure 5:
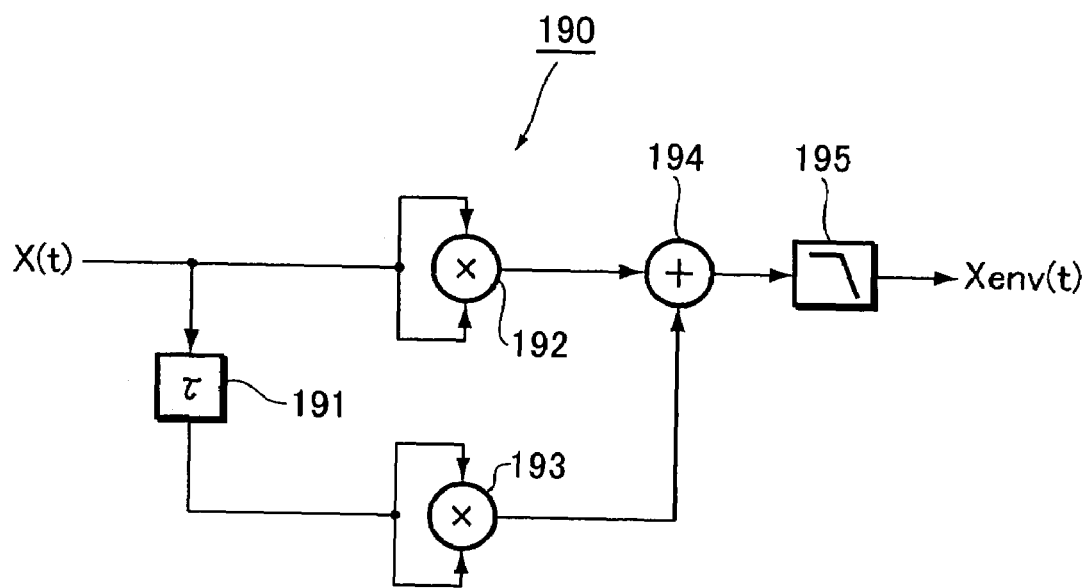
FIGS. 5A and 5B are block diagrams showing configurations of the input envelope detection means shown in FIG. 3.
Figure 5:
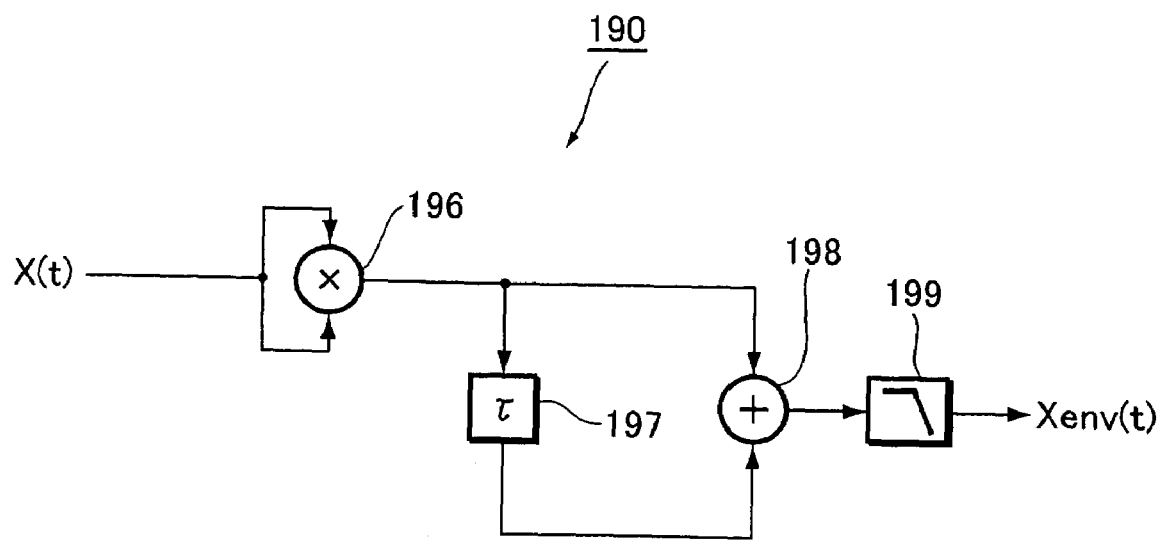

Next, the input envelope detection means 190 will be described with reference to FIG. 5. FIGS. 5A and 5B are block diagrams showing examples of configuration of the input envelope detection means 190. In FIG. 5A, the input envelope detection means 190 comprises a delay unit 191, multipliers 192 and 193, an adder 194, and a low-pass filter 195. The delay unit 191 holds the input signal X(t) over the unit delay time τ in synchronization with the reference clock, and outputs the delayed value X(t−1) of the delayed input signal to the multiplier 193. The multipliers 192 and 193 determines the squares of the input signal X(t) and the delayed value X(t−1) thereof, respectively. The adder 194 adds the squared values output from the multipliers 192 and 193, and outputs the resultant to the low-pass filter 195 in the subsequent stage. The low-pass filter 195 removes high frequency components of the input signal X(t), thereby obtaining the envelope Xenv(t) which consists chiefly of the direct current component of the input signal. Here, the time constant of the low-pass filter 195 is set at a value corresponding to the period at which the reception wave signal varies because of Doppler fading. Consequently, the input envelope detection means 190 extracts the envelope Xenv(t) as an amount corresponding to the field intensity of the input signal which varies slowly because of Doppler fading.

Incidentally, the input envelope detection means 190 may have the configuration shown in FIG. 5B. In this case, the input envelope detection means 190 comprises a multiplier 196, a delay unit 197, an adder 198, and a low-pass filter 199. The multiplier 196 determines the square of the input signal X(t), and outputs it to the delay unit 197 and the adder 198. The delay unit 197 holds the squared value of the input signal X(t) over the unit delay time τ, and outputs the value delayed by the time τ to the adder 198. The adder 198 adds the squared value of the input signal X(t) and the value delayed by the time τ, and outputs the resultant to the low-pass filter 199 in the subsequent stage. The low-pass filter 199 removes high frequency components of the input signal X(t), thereby obtaining the envelope Xenv(t) which consists chiefly of the direct current component of the input signal. According to the input envelope detection means 190 configured as shown in FIG. 5B, the envelope Xenv(t) can be determined by using the configuration with a smaller number of computing units. This means a relative increase in operation speed.

Returning to FIG. 3, the comparator 180 subtracts the envelope Xenv(t) of the input signal determined by the input envelope detection means 190 from the envelope Yenv(t) of the filter output signal, i.e., determines an error err(t) based on the following equation (2). The error err(t) is output to the coefficient updating means 160.

$$\text{err}(t)=Y\text{env}(t)-X\text{env}(t) \quad (2)$$

Figure 6:
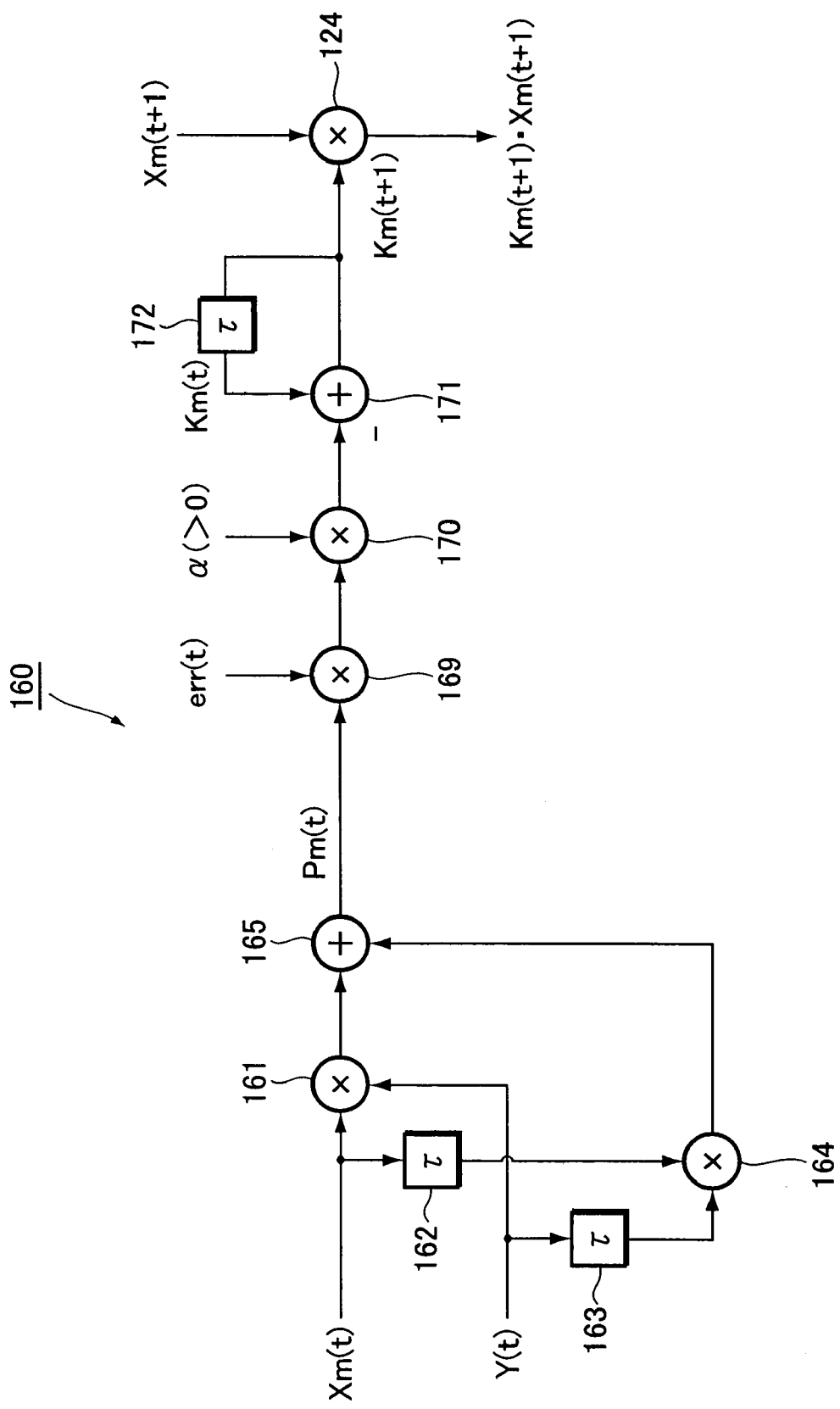
FIG. 6 is a block diagram showing a configuration of the coefficient updating means shown in FIG. 3.

The coefficient updating means 160 updates the tap coefficients Km of the respective coefficient multipliers 121–127 so as to minimize the error err(t). A concrete configuration of the coefficient updating means 160 is shown in FIG. 6. FIG. 6 is a block diagram of coefficient updating means 160 that updates the tap coefficient Km of the coefficient multiplier 124 in the mth stage. Similar coefficient updating means 160 are provided for the coefficient multipliers 121–127 in the zeroth, first, second, . . . , (N−1)th stages, respectively.

Now, the coefficient updating means 160 for updating the tap coefficient Km will be described representatively with reference to FIG. 6. For input variables, the coefficient updating means 160 receives the delayed value Xm(t) of the input signal X(t), delayed by m unit delay times, along with the filter output signal Y(t) and the error err (t) described above. The coefficient updating means 160 determines a tap coefficient Km(t+1) to be used at the next operation time, and supplies it to the coefficient multiplier 124 in the mth stage.

Specifically, the tap coefficient Km is updated based on tap coefficient updating equations given by the following equations (3-1) and (3-2):

$$Km(t+1)=Km(t)-\alpha \cdot \text{err}(t) \cdot Pm(t) \quad (3\text{-}1).$$

Here, $$Pm(t)=Xm(t) \cdot Y(t)+Xm(t-1) \cdot Y(t-1) \quad (3\text{-}2)$$

where $\alpha > 0$.

In FIG. 6, the delayed value Xm(t) and the filter output signal Y(t) input to the coefficient updating means 160 are multiplied by each other in a multiplier 161, and output to an adder 165 in the subsequent stage. The delayed value Xm(t) of the input signal and the filter output signal Y(t) are also held in delay units 162 and 163 over the unit delay time τ. These held values, i.e., the values of the respective signals at the time one reference clock before are input to a multiplier 164. The multiplier 164 multiplies these delayed values, and outputs the resultant to the adder 165.

The adder 165 adds the values output from the multiplies 161 and 164, and outputs the value Pm(t) which is based on the foregoing equation (3-2). Here, the value Pm(t) is an amount corresponding to the correlation between the delayed value Xm(t) of the input signal and the filter output signal Y(t). The value Pm(t) will be referred to also as the amount of correlation.

A multiplier 169 multiplies the output of the adder 165, or the value Pm(t), and the error err(t) determined by the comparator 180 described above, and outputs the resultant to a multiplier 170 in the subsequent stage. The multiplier 170 multiplies the output value of the multiplier 169 by an attenuation coefficient α, a constant, and outputs the resultant to the negative input terminal of a subtractor 171. Incidentally, the attenuation coefficient α is a positive value which is set appropriately. The attenuation coefficient α is determined through experiments in advance in view of a balance between the time of convergence of the tap coefficient Km(t) and the stability of the coefficient update during the adaptive processing of the filter.

A delay unit 172 holds the tap coefficient Km(t) in the operation period in question (at current time), and outputs the tap coefficient Km(t) to the positive input terminal of the subtractor 171 mentioned above. The subtractor 171 subtracts the output value of the multiplier 170 from the tap coefficient Km(t) at the present operation period, thereby determining a tap coefficient Km(t+1) for the next operation period. The subtractor 171 outputs the resultant to the coefficient multiplier 124. Consequently, the tap coefficient Km(t) of the coefficient multiplier 124 in the mth stage is updated.

Note that the coefficient multipliers 121–126 in the zeroth, first, second, . . . , (N−1)th stages are also provided with similar coefficient updating means 160, respectively. The individual tap coefficients Km(t) are thus updated within the operation period in question. Then, the tap coefficients Km(t) are updated repeatedly so that the error err(t) between the envelope Yenv(t) of the delayed filter output signal and the envelope Xenv(t) of the input signal finally becomes zero. Through the operations of converging the individual tap coefficients Km(t), the adaptive processing of the digital filter 110 for eliminating multipath distortion can be executed accurately.

Figure 7:
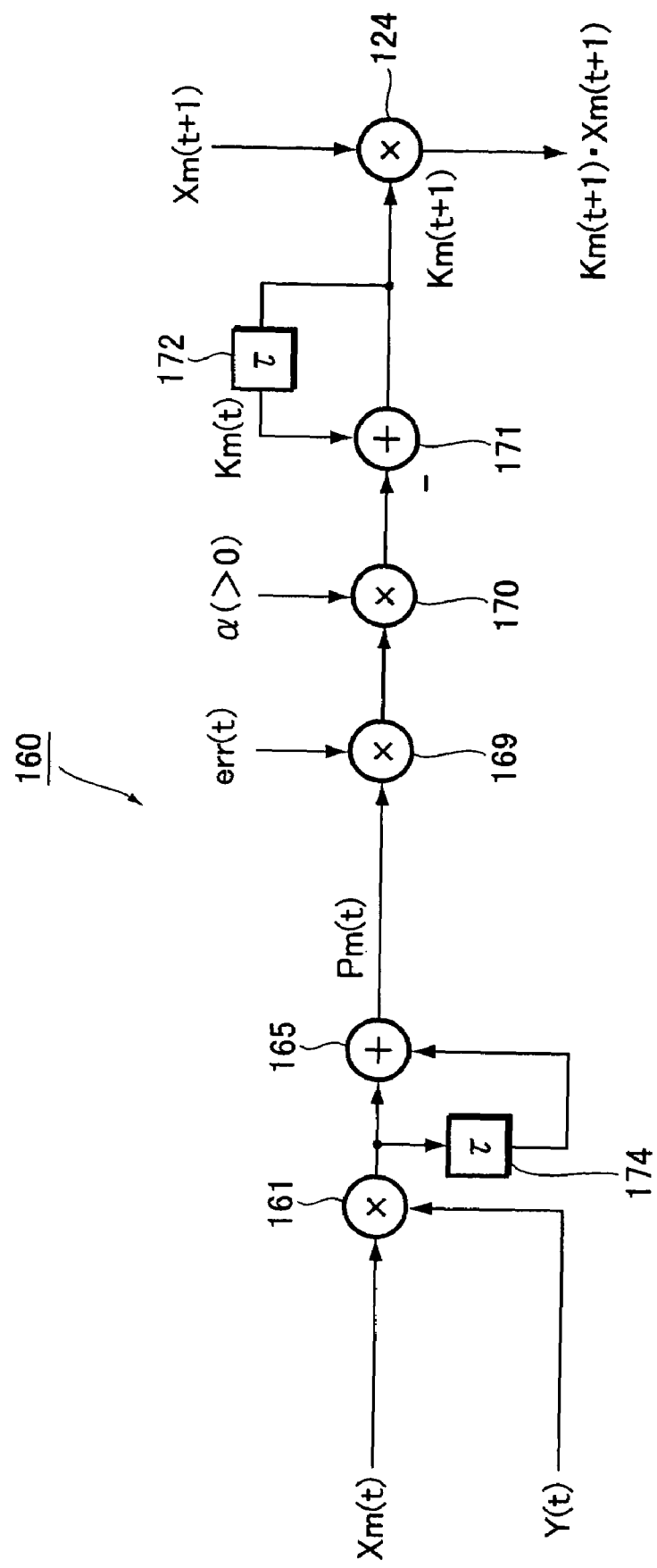
FIG. 7 is a block diagram showing another configuration of the coefficient updating means shown in FIG. 3.

Incidentally, the value Pm(t) of the amount of correlation mentioned above may be computed by an arithmetic circuit having the configuration shown in FIG. 7. FIG. 7 is a block diagram showing the configuration of the coefficient updating means 160, or a diagram showing another embodiment. In the diagram, the same components as those shown in FIG. 6 are designated by identical reference numerals or symbols.

As shown in FIG. 7, the multiplier 161 multiplies the delayed value Xm(t) of the input signal and the filter output signal Y(t) by each other, and outputs the resultant to the adder 165 and a delay unit 174 in the subsequent stage. The delay unit 174 holds the multiplied value Xm(t)·Y(t) over the unit delay time τ, and outputs the delayed value Xm(t−1)·Y(t−1) to the adder 165.

The adder 165 adds the respective outputs of the multiplier 161 and the delay unit 174 to determine the value Pm(t) based on the equation (3-2). The value Pm(t) is output to the multiplier 169.

According to the adaptive filter 100 having the coefficient updating means configured as shown in FIG. 7, the value Pm(t) of the amount of correlation based on the equation (3-2) can be determined with a smaller number of computing units. It is therefore possible to save the hardware resource and improve the operation speed.

Figure 8:
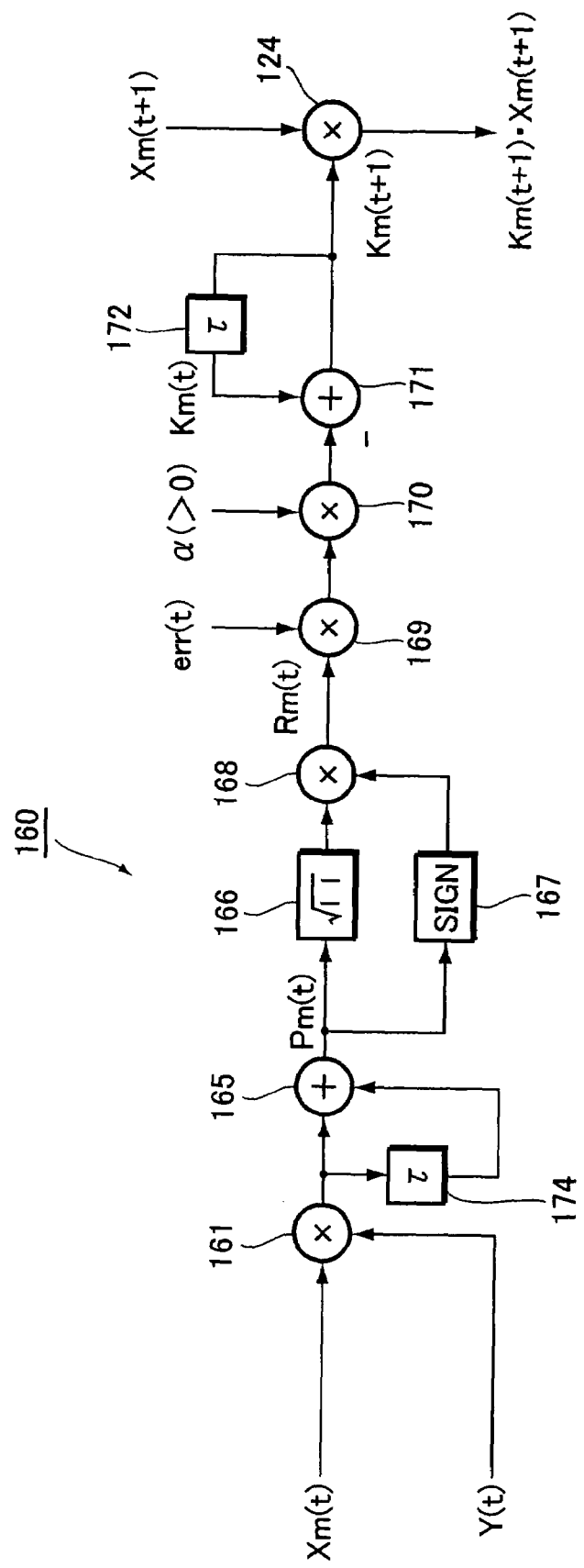
FIG. 8 is a block diagram showing still another configuration of the coefficient updating means shown in FIG. 3.

Moreover, the adaptive filter 100 may use coefficient updating means 160 having the configuration shown in FIG. 8, in which case the value Pm(t) of the amount of correlation is subjected to compression arithmetic processing in updating the tap coefficient Km. FIG. 8 is a block diagram showing the configuration of the coefficient updating means 160, or a diagram showing another embodiment. In the diagram, the same components as those shown in FIG. 7 are designated by identical reference numerals or symbols.

In FIG. 8, the value Pm(t) output from the adder 165 is input to a square root computing unit 166 and a sign converter 167, and thereby converted into a value Rm(t) which is given compression conversion processing based on the following equation (4-1). More specifically, the square root computing unit 166 determines a square root of the absolute value of the value Pm(t), and outputs it to a multiplier 168 in the subsequent stage. Meanwhile, the sign converter 167 converts the sign of the value Pm(t) into 1, 0, or −1 as given by the following equation (4-2), and outputs it to the multiplier 168. The multiplier 168 multiplies these values to convert the value Pm(t) into the value Rm(t) which is given the compression conversion processing expressed by the following equations (5-1) and (5-2). The multiplier 168 outputs the value Rm(t) to the multiplier 169. Then, the tap coefficient Km(t+1) for the next operation period is determined based on the following equation (6), and supplied to the mth coefficient multiplier 124, whereby the tap coefficient Km(t) is updated.

$$Rm(t) = \text{SIGN}\{Pm(t)\} \cdot \sqrt{|Pm(t)|} \quad (4\text{-}1),$$

where $$\text{SIGN}(Pm) = 1 \ (Pm > 0), \ 0 \ (Pm = 0), \ or \ -1 \ (Pm < 0) \quad (4\text{-}2)$$

$$\text{When } Pm(t) \geq 0, \ Rm(t) = \sqrt{|Pm(t)|} \quad (5\text{-}1).$$

$$\text{When } Pm(t) < 0, \ Rm(t) = -\sqrt{|Pm(t)|} \quad (5\text{-}2)$$

$$Km(t+1) = Km(t) - \alpha \cdot \text{err}(t) \cdot Rm(t) \quad (6)$$

According to the adaptive filter 100 having the coefficient updating means 160 configured as shown in FIG. 8, the compression conversion processing based on the equation (4-1) is applied to the value Pm(t), or the amount of correlation between the delayed value Xm(t) of the input signal and the delayed filter output signal Y(t). It is therefore possible to avoid such errors as numeric overflow and rounded fractions occurring in the course of the arithmetic processing, and converge the tap coefficients Km(t) at speed with reliability.

Incidentally, the foregoing compression conversion processing of converting the amount of correlation, or the value Pm(t), into the value Rm(t) need not necessarily use the conversion function for determining a square root. For example, the same advantageous effects as those described above can also be obtained based on functions for determining roots of higher order, such as a cube root.

In the adaptive processing performed by the adaptive filter 100 of the present embodiment, the tap coefficients Km are updated so that the error err(t) determined by subtracting the envelope Xenv(t) of the input signal from the envelope Yenv(t) of the filter output signal for comparison becomes zero. The envelope Xenv(t) of the input signal is an amount reflecting the components of variation in the filed intensity of the reception wave which varies because of Doppler fading. Since this amount is used as the reference value for making the envelope Yenv(t) of the filter output constant, the variation components ascribable to Doppler fading are cancelled by the comparator 180. This makes it possible to remove only the multipath-based distortion components which make amplitude variations in short periods.

Since the updating operation of the tap coefficients Km can achieve fast convergence without being affected by slow variation components ascribable to Doppler fading, it is possible to stabilize the adaptive processing.

The foregoing embodiment has dealt with the case where the present invention is applied to a digital filter that is formed as an FIR type. It is understood, however, that the present invention is not limited to FIR type digital filters, but may be applied to digital filters of IIR type and the like.

While there has been described what are at present considered to be preferred embodiments of the present invention, it will be understood that various modifications may be made thereto, and it is intended that the appended claims cover all such modifications as fall within the true spirit and scope of the present invention.

What is claimed is:

1. A multipath distortion eliminating filter comprising:
  a digital filter for applying filter operation processing to a digital reception signal, as an input signal, containing a multipath-based distortion component, to eliminate the distortion component, the digital filter having a plurality of tap coefficients;
  error detection means for detecting an error between amplitude of an output signal output from the digital filter and a reference value;
  coefficient updating means for predicting and computing a filter characteristic of the digital filter so as to minimize the error detected, and updating each of the tap coefficients of the digital filter based on the result predicted and computed; and
  detection means for detecting amplitude of the input signal, said detection means variably setting said reference value according to the detected amplitude of the input signal.

2. The multipath distortion eliminating filter according to claim 1, wherein said detection means comprises:
  a multiplier for determining a square of said input signal in an operation period in question;
  storing means for holding the squared value determined by said multiplier for a unit delay time; and
  an adder for adding the squared value and a stored value stored in said storing means,
  wherein said detection means detects the added value determined by said adder as the amplitude of said input signal.

3. The multipath distortion eliminating filter according to claim 1, wherein
  said error detection means comprises:
  a multiplier for determining a square of said output signal in an operation period in question;
  storing means for holding the squared value determined by said multiplier for a unit delay time;
  an adder for adding the squared value and a stored value stored in said storing means; and
  a comparator for comparing the added value determined by said adder, as the amplitude of said output signal, and said reference value.

4. The multipath distortion eliminating filter according to claim 1, wherein
  said digital filter has a plurality of coefficient multipliers corresponding to said tap coefficients, respectively; and
  said coefficient updating means determines an amount of correlation between a delayed value of said input signal input to each of said coefficient multipliers of said digital filter and said output signal, and determines an amount of update of each of said tap coefficients based on a multiplied value determined by multiplying the amount of correlation and the error.

5. The multipath distortion eliminating filter according to claim 4, wherein
  said coefficient updating means comprises:
  a multiplier for multiplying each of said delayed values of said input signal and said output signal in an operation period in question;
  storing means for holding the multiplied value determined by said multiplier for a unit delay time; and
  an adder for adding the multiplied value and a stored value stored in said storing means,
  wherein said coefficient updating means conducts computation with the added value determined by said adder as the amount of correlation.

6. The multipath distortion eliminating filter according to claim 1, wherein
  said digital filter has a plurality of coefficient multipliers corresponding to said tap coefficients, respectively; and
  said coefficient updating means determines an amount of correlation between a delayed value of the input signal input to each of the coefficient multipliers of the digital filter and said output signal, and determines an amount of update of each of said tap coefficients based on a multiplied value determined by multiplying the amount of correlation given a compression conversion processing and the error.

7. The multipath distortion eliminating filter according to claim 6, wherein said compression conversion processing is an arithmetic processing for converting the amount of correlation into a square root of an absolute value thereof to which a sign of the amount of correlation is attached.

8. The multipath distortion eliminating filter according to claim 7, wherein
  said coefficient updating means comprises:
  a multiplier for multiplying each of said delayed values of said input signal and said output signal in an operation period in question;
  storing means for holding the multiplied value determined by said multiplier for a unit delay time; and
  an adder for adding the multiplied value and a stored value stored in said storing means,
  wherein said coefficient updating means conducts computation with the added value determined by said adder as the amount of correlation.

* * * * *